United States Patent [19]

Calawa et al.

[11] Patent Number: 4,952,527
[45] Date of Patent: Aug. 28, 1990

[54] METHOD OF MAKING BUFFER LAYERS FOR III-V DEVICES USING SOLID PHASE EPITAXY

[75] Inventors: Arthur R. Calawa, Wellesley; Frank W. Smith, Cambridge; Michael J. Manfra, Tewksbury; Chang-Lee Chen, Sudbury, all of Mass.

[73] Assignee: Massachusetts Institute of Technology, Cambridge, Mass.

[21] Appl. No.: 157,806

[22] Filed: Feb. 19, 1988

[51] Int. Cl.$^5$ .................. H01L 21/203; H01L 21/20; H01L 21/324

[52] U.S. Cl. .................. 437/107; 148/DIG. 3; 148/DIG. 25; 148/DIG. 41; 148/DIG. 56; 148/DIG. 154; 156/612; 437/82; 437/108; 437/132; 437/247; 437/912; 437/111; 437/939; 437/973

[58] Field of Search .................. 148/DIG. 3, 4, 17, 25, 148/41, 56, 65, 71, 72, 110, 139, 149, 160, 169; 156/610–615; 357/16, 23.2, 59, 60, 15; 437/22, 39, 41, 81, 82, 107, 108–112, 126, 132, 176, 173, 247, 174, 712, 936, 939, 946, 963, 973, 976

[56] References Cited

U.S. PATENT DOCUMENTS

| | | | |
|---|---|---|---|
| 3,929,527 | 12/1975 | Chang et al. | 156/610 |
| 4,186,410 | 1/1980 | Cho et al. | 437/107 |
| 4,218,271 | 8/1980 | Wood | 437/107 |
| 4,554,030 | 11/1985 | Haisma et al. | 156/612 |
| 4,559,091 | 12/1985 | Allen et al. | 437/84 |
| 4,575,462 | 3/1986 | Dobson et al. | 437/107 |
| 4,632,710 | 12/1986 | Van Rees | 437/111 |
| 4,699,688 | 10/1987 | Shostry | 156/606 |
| 4,707,216 | 11/1987 | Morkoc et al. | 156/610 |

OTHER PUBLICATIONS

Chang et al., "Growth of High Quality GaAs Layers Directly on Si . . . ", J. Vac. Sci. Technol., B5(3), May/Jun. 1987, pp. 815–818.
Akiyama et al., "Growth of High Quality GaAs Layers on Si . . . ", J. Crys. Growth, 77 (1986), pp. 490–497.
Akiyama et al., "Growth of GaAs on Si by MOCUD", J. Crys. Growth, 68 (1984), pp. 21–26.
Chand et al., "Significant . . . Molecular Beam Expitaxially Grown GaAs on Si(100) . . . ", Appl. Phys. Lett., 49(13), Sep. 29, 1986, pp. 815–817.
Duncan et al., "Photoluminescence . . . Heteroepitaxial Gallium Arsenide on Silicon", J. Appl. Phys., 59(6), Mar. 15, 1986, pp. 2161–2164.
Fischer et al., "Dislocation Reduction in Epitaxial GaAs on Si (100)", Appl. Phys. Lett., 48(18), May 5, 1986, pp. 1223–1225.
Fischer et al., "Characteristics of GaAs/AlGaAs MODFETs Grown Directly on (100) Silicon", Electron Lett., 20(1984), pp. 945–948.
Muratani et al., "Growth Temperature Dependence in Molecular Beam Epitaxy of Gallijm Arsenide", J. Crys. Growth, 45 (1978), pp. 302–308.
"Channel and Substrate Currents in GaAs FETS Due to Ionizing Radiation", R. Zuleeg, et al., *IEEE Transaction on Nuclear Science* NS-30: 4151–4156 (1983).
"The Effects of Transient Radiation on GaAs Schottky Diode FET Logic Circuits", E. R. Walton et al., *IEEE Transactions on Nuclear Science* NS-30: 4178–4182 (1983).

(List continued on next page.)

*Primary Examiner*—Brian E. Hearn
*Assistant Examiner*—William Bunch
*Attorney, Agent, or Firm*—Hamilton, Brook, Smith & Reynolds

[57] ABSTRACT

A new III-IV buffer material is described which is produced by low temperature growth of III-V compounds by MBE that has unique and desirable properties, particularly for closely spaced, submicron gate length active III-V semiconductor devices, such as HEMT's, MESFET's and MISFET's. In the case of the III-V material, GaAs, the buffer is grown under arsenic stable growth conditions, at a growth rate of 1 micron/hour, and at a substrate temperature preferably in the range of 150 to about 300° C. The new material is crystalline, highly resistive, optically inactive, and can be overgrown with high quality III-V active layers.

10 Claims, 2 Drawing Sheets

OTHER PUBLICATIONS

"New MBE Buffer Used to Eliminate Backgating in GaAs MESFETs", F. W. Smith, et al., *IEEE Electron Device Letters*, EDL-9:77 91988).

"New MBE Buffer Used to Eliminate Backgating in GaAs MESFET's", F. W. Smith, et al., *MIT Lincoln Laboratory Solid State Research Quarterly Technical Report*, (Distributed 2/23/87), pp. 1–10.

"Effects of Very Low Growth Rates of GaAs Grown by Molecular Beam Epitaxy at Low Substrate Temperatures", G. M. Metze, et al., *Appl. Phys. Lett.* 42(9), 42:818–820 (1983).

"Molecular Beam Epitaxial Growth of InP", J. H. McFee et al., *J. Electrochem. Soc.* 124:259–272 (1977).

"Photoluminesence of $Al_xGa_{1-x}As$ Grown by Molecular Beam Epitaxy", G. Wicks, et al., *J. Appl. Phys.* 52(9), pp. 5792–5796 (1981).

"Effect of Growth Temperature on the Photoluminescent Spectra From Sn-doped $Ga_{1-x}Al_xAs$ Grown by Molecular Beam Epitaxy", V. Swaminathan, et al., *Appl. Phys. Lett.* 38:347–349 (1981).

"An Investigation of GaAs Films Grown by MBE at Low Substrate Temperatures and Growth Rates", G. M. Metze et al., *J. Vac. Sci. Technol. B* 1(2), American Vacuum Society, pp. 166–169 (1983).

"New MBE Buffer for Micron and Quarter-Micron Gate GaAs MESFET's", F. W. Smith et al., IEEE Cornell Conference on High Speed Semiconductor Devices–Abstract, Aug. 11, 1987.

"New MBE Buffer for Micron and Quarter-Micron Gate GaAs MESFETs", *IEEE*, Cornell Conference on High Speed Semiconductor Devices and Circuits (1987), Piscataway, N.J., p. 229, F. W. Smith et al.

"Monolithic Integration of a GaAlAs injection laser with a Schottky-Gate Field", F. Fukuzawa, et al., *Appl. Phys. Lett.* 36(3) American Institute of Physics, pp. 181–183 (1980).

"GaAs Integrated Optoelectronics", Bar-Chaim et al., *IEEE Transactions on Electron devices*, vol. Ed-29, No. 9, pp. 1372–1381 (1982).

"Monolithic two-Dimensional Surface-Emitting Arrays of GaA2/AlGaA Diode", J. P. Donnelly et al., *Appl. Phys. Lett. 51(15), American Institute of Physics, pp. 1138–1140 (1987).*

"Deep Levels in Molecular-Beam-Epitaxial GaAs", R. A. Stall et al., *Electronic Letters, vol. 16, No. 5, pp. 171–172, (1980).*

"Growth Temperature Dependence in Molecular Beam Epitaxy of Galium Arsenide", T. Murotani et al., *Journal of Crystal Growth* 45, North-Holland Publishing Company, pp. 302–08 (1978).

"Temperature Range for Growth of Autoepitaxial GaAs Films by MBE", *Journal of Crystal Growqth* 43, North-Holland Publishing Company, pp. 204–208 (1978).

"New MBE Buffer for Micron and Quarter-Micon Gate GaAs Mesfets", F. W. Smith, et al., *1987 IEEE Device Research on High Speed Semiconductor Devices Abstract, Jun. 24, 1987.*

Maezawa et al., *IEEE Electron Device Lett.*, EDL7, 454 (1986), "Large Transconductance n+-Ge Gate AlGaAs/GaAs MISFET with Thin Gate Insulator".

Casey & Cho, "Insulating Layers by MBE: in *The Technology and Physics of Molecular Beam Epitaxy*, E. H. C. Parker (ed.), Plenum Press, NY, 1985, Chapter 13, pp. 413–423, Insulating Layers by MBE".

Naganuma and Takahashi, *Phys. Stat. Sol. (a)31:187 (1975)*, "GaAs, GaP and $GaAs_{1-x}P_x$ Films Deposited by Molecular Beam Epitaxy".

Stanley et al., "MBE of InP and other P-containing Compounds", *The Physics and Technology of Molecular Beam Epitaxy, E. H. C. Parker (ed.), Plenum Press, NY, (1985), pp. 275–311.*

Weisbuch et al., *Inst. Phys. Conf.* Ser. No. 56, pp. 711–720 (1981), "Optical Properties and Interface Disorder of $GaAs-Al_xGa_{1-x}As$ Multi-Quantum Well Structures".

METHOD OF MAKING BUFFER LAYERS FOR III-V DEVICES USING SOLID PHASE EPITAXY

GOVERNMENT RIGHTS

The U.S. Government has rights in this invention pursuant to U. S. Air Force Contract No. F19628-85-C-0002.

BACKGROUND ART

Semiconductor compounds of the III-V materials and alloys thereof; such as the compounds gallium arsenide (GaAs) and indium phosphide (InP) and the alloy aluminum gallium arsenide (AlGaAs) have unusual optoelectronic properties which make them attractive for many applications; ranging from microwave devices to optoelectronic devices. Among these applications is the use of such materials to make devices for high-speed logic integrated circuits and for microwave integrated circuits. The Schottky-barrier gate metal-semiconductor-field-effect transistor (MESFET) is a typical device used in these integrated logic circuits.

The MESFET is a three terminal device consisting of a source, gate and drain. The source and drain terminals form low resistance contacts to a channel whose conduction is controlled by the depletion field of a Schottky-barrier gate. The conducting channel, which is placed on a semi-insulating (SI) substrate, may be formed either by ion implantation into the semi-insulating material, or by epitaxially growing the active layer on semi-insulating material.

A number of problems associated with MESFET devices and circuits are attributed to the SI substrate. Such problems include backgating (or sidegating), hysteresis in the dependence of the drain-source current $I_{ds}$ upon drain-source voltage $V_{ds}$, light sensitivity, low output resistance $R_d$, low source-drain breakdown voltage $BV_{SD}$, and low output power gain at RF frequencies. Among these problems, backgating is the most significant for both digital and analog circuit applications.

In addition to these problems, increased subthreshold leakage current, threshold voltage shifts, and the inability to fully pinch-off the device for large $V_{ds}$ can occur as the gate length of MESFET's is reduced to submicron dimensions. Also, $R_d$ and $BV_{SD}$ are further decreased as the gate length is reduced. These problems are called short-channel effects and the characteristics of the layer underlying the active region can have a profound influence on them.

Backgating or sidegating is the change of $I_{ds}$ in a MESFET as a result of a voltage applied to the substrate or an adjacent, add nominally isolated, contact pad (sidegate). Even though the sidegate and MESFET may be physically separated, as by mesa etching, the interaction may still arise because the substrate is of finite resistivity and charge can accumulate at the interface between the active layer and the substrate. In response to changes in voltage on the substrate or adjacent devices, the substrate conducts enough current to modulate the interface space-charge region. When this interfacial depletion region widens into the active channel, the device current is reduced.

A buffer layer is often inserted between the active layer and the substrate to alleviate the problem of backgating. To reduce backgating and other substrate related effects, the buffer layer should provide an increase in bulk resistivity. A number of possible buffer layers have been suggested, including undoped GaAs, AlGaAs, and superlattice (GaAs/AlGaAs) buffers. Heretofore such buffer layers have met with only limited success.

DISCLOSURE OF THE INVENTION

The invention comprises a crystalline buffer layer of III-V material or an alloy thereof and a process for growing such a layer on a substrate by molecular beam epitaxy (MBE) at low substrate temperatures. The buffer layer thus grown is optically inert or inactive, that is, the electrical conductivity of the material is substantially insensitive to light and the material is substantially non-luminescent. Furthermore, the layer is electrically insulating. After the buffer layer is grown to a suitable thickness, the outer surface is reconstructed and stabilized to enable good quality crystal growth of subsequent layers. Reconstruction is achieved by annealing in an ambient containing the more volatile of the III-V species, i.e., for GaAs the ambient is As; for InP the ambient is P.

The function of stabilization is to prevent or minimize out-diffusion of the more volatile specie from the low temperature buffer layer. This may be achieved by providing a careful choice of initial regrowth temperature, to produce a buffer stabilizing layer over the low temperature buffer layer. Alternatively, a buffer stabilizing layer of material, which is capable of preventing out-diffusion, may be grown over the low temperature buffer layer.

BEST MODE OF CARRYING OUT THE INVENTION

I. GaAs MESFET EMBODIMENT

Figure 1:
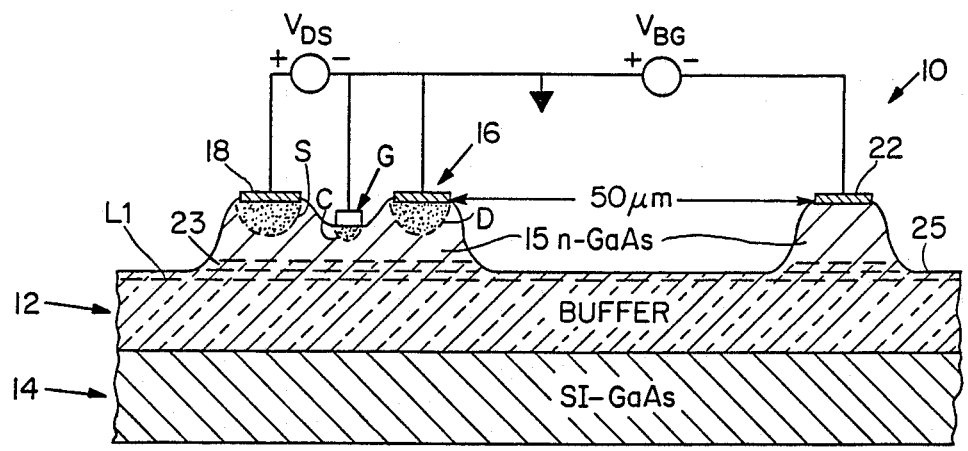
FIG. 1 is a schematic cross-section of a GaAs MESFET and backgate terminal formed on a buffer layer of the invention.

Referring now to FIG. 1, the invention will be described in detail in connection therewith. It should be understood that while the device of FIG. 1 is a GaAs MESFET structure, other devices and other III-V materials are contemplated as being within the scope of the invention. FIG. 1 is a schematic cross-section of a GaAs MESFET structure 10 made in accordance with the invention to include a new buffer layer 12 and buffer stabilizing layer 23.

Note: While the term "layer" is used to define the films formed on substrates, it is intended that this term also covers films disposed in regions of the substrate other than the entire substrate surface.

Buffer layer 12 is formed by MBE on a SI-GaAs substrate using Ga and As₄ beam fluxes, under arsenic stable growth conditions, at optimal substrate temperatures between 150 to 250° C., and at growth rates of 1 micron/hour.

The range of 150–250° C. is believed to be an optimal growth temperature range to produce the buffer layer 12. However, temperatures below 300° C. are contemplated as being suitable for buffer layer growth. These growth temperatures are substantially lower than those used in previous studies of GaAs grown by MBE at low substrate temperatures ["Growth -Parameter Dependence of Deep Levels in Molecular-Beam-Epitaxial GaAs", Stall et al., *Electronics Letters*, (1980) 171–172; "Growth Temperature Dependence in Molecular Beam Epitaxy of Gallium Arsenide", Murotani et al., *Journal of Crystal Growth* 45 (1978) 302–308; "Temperature Range for Growth of Autoepitaxial GaAs Films by MBE", Neave et al., *Journal of Crystal Growth* 43 (1978) 204–208; "An Investigation of GaAs Films Grown by MBE at Low Substrate Temperatures and Growth Rates", Metze et al., *J. Vac. Sci. Technol.* B1(2), (1980) 166–169].

The reflected high energy electron diffraction (RHEED) pattern observed during growth, for substrate temperatures as low as 200° C., indicates that the buffer is crystalline. This result has been confirmed by double-crystal x-ray diffraction. The buffer layer resistivity increases with decreasing growth temperature, but below 200° C. it has not presently been possible to grow crystalline layers of sufficient thickness. All the data presented here are for buffers grown at 200° C. The resistivity of the buffer layers grown is in excess of $10^7$ ohm-cm. The exact resistivity could not be determined using conventional Hall-effect measurement techniques, because the resistivity exceeds the measuring capability of our equipment. The material is non-stochiometric GaAs having an excess of about 1% As, as determined by Auger Electron Spectroscopy.

After a buffer layer 12 of about 2 microns is grown as described above, on an SI-GaAs substrate, the structure is brought to a temperature of between about 480 and 580° C. and heat treated in an arsenic ambient at that temperature for about 10 minutes to reconstruct the exposed surface 25 of layer 12 to a short depth illustrated by the dotted line L1. Next, a thin (30–200Å) buffer stabilizing layer 23 of GaAs is deposited by MBE at a relatively low growth temperature of 550° C. or less. The heat treatment appears to alleviate surface crystalline defects and the stabilizing layer enables subsequent growth of good quality crystalline GaAs layers 15 on the buffer stabilizing layer 23. As an alternative to regrowth of the GaAs, other materials capable of preventing out-diffusion, but having appropriate lattice matching feature for growth of active layer thereon, may be used, such as, Al, AlGaAs, or a thin GaAs/AlGaAs superlattice.

An 0.3 micron thick n-doped GaAs layer is then grown by MBE on layer 23 at typical MBE GaAs growth temperature of 600° C. MESFET's 16 were then fabricated on the doped GaAs layer by conventional etching and metallization processes.

For experimental purposes, in order to demonstrate backgating performance, a sidegate 22 was formed adjacent to MESFET 16 and mesa-isolated by etching up to, or into, the top surface 25 of buffer layer 12.

MESFET 16 consists of an n⁺ source region S and an n⁺ drain region D, laterally separated by an n-channel region C formed beneath a (Schottky) metal gate electrode G. Ohmic contacts 18 of Ni/Ge/Au or Pd/Ge/Au are formed on the source and drain regions. The gate electrode G is formed of Ti/Au.

The measured gate length, gate width, and source-drain spacing of this experimental device are 2, 98, and 5.5 microns, respectively. An ohmic contact 22, isolated from the MESFET 16 by mesa etching, served as the sidegate. For comparative purposes, MESFET's, as described above, were fabricated in MBE n-GaAs layers grown upon the buffer stabilizing layer 23 of the invention and also upon buffer layers of undoped GaAs, AlGaAs, and GaAs/AlGaAs superlattices. All the buffer layers were grown by MBE and were 2 microns thick. In each case, the active layer 15 was doped to approximately $2 \times 10^{17}$ cm$^{-3}$ with silicon and was 0.3 microns thick. MESFET's were also fabricated in commercial vapor phase epitaxy (VPE) n-GaAs layers deposited on SI GaAs substrates and on layers made by direct ion implantation into the SI GaAs substrates. The gate recess depth is roughly half the active layer thickness, and mesa etching was used to isolate the devices.

Figure 2:
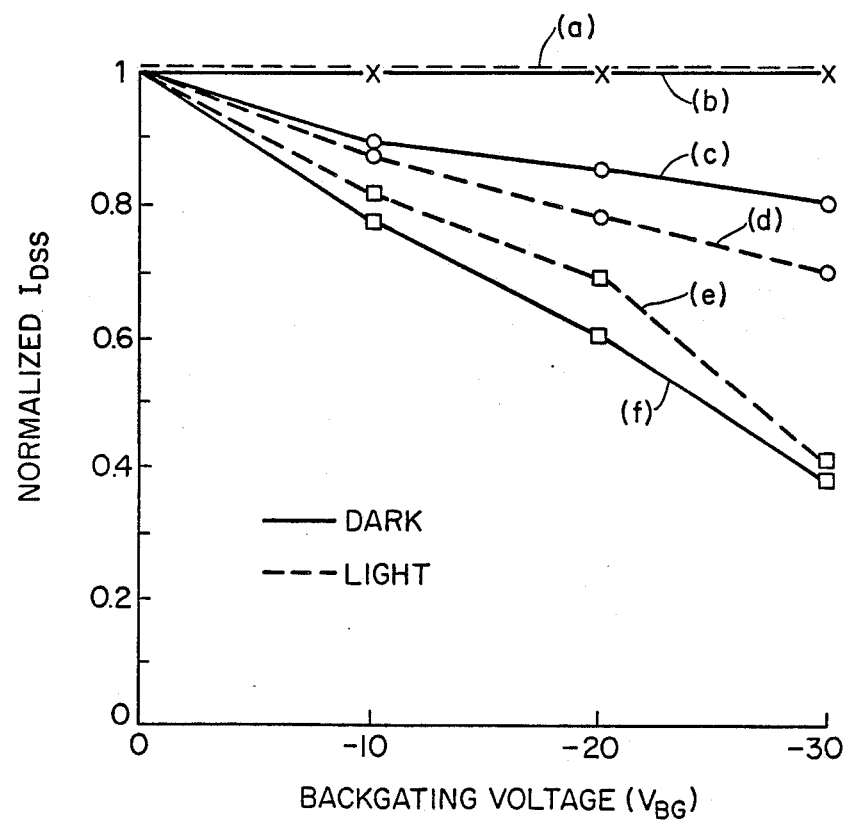
FIG. 2 is a plot of normalized saturated drain source current ($I_{DSS}$) versus backgating voltage for GaAs MESFET's fabricated in accordance with the invention (curves a and b) and GaAs MESFET's fabricated using prior art techniques (curves c-f).

The most dramatic improvement in device performance provided by the new buffer layer is the elimination of backgating, as illustrated by FIG. 2. FIG. 2 is a plot of normalized $I_{dss}[I_{dss}(V_{BG})/I_{dss}(O)]$ plotted versus applied backgating voltage $V_{BG}$. A sidegate 22 spaced 50 microns from the MESFET 16 and a drain to source voltage of 2.5 V are used. Data obtained both in the dark (solid line) and in white light (dotted line) are shown. The lines in the figure are included only as a convenience in visualizing the data.

The data in FIG. 2 provides a comparison between backgating in MESFET's fabricated in active layers on the new buffer 12 (curves a and b) with backgating in MESFET's fabricated in active layers on an undoped GaAs buffer (curves e and f) and on an undoped GaAs/Al$_{0.45}$Ga$_{0.55}$As superlattice buffer grown by MBE at 700° C. (curves c and d). Both GaAs and superlattice buffered devices show backgating and light sensitivity, while the device with the new buffer shows neither. Although not shown here, MESFET's fabricated using all of the other buffers show light sensitivity and backgating. Of the alternative buffers, the AlGaAs and superlattice buffers grown at 700° C. appear to be the best.

Although the data presented in FIG. 2 were measured using a sidegate spaced 50 microns from the MESFET 16, a sidegate spaced 15 microns from the MESFET was also used. For −50 V applied to the sidegate and $V_{ds} = 2.5$ V, the new buffered device still showed no backgating. For the same voltages, $I_{dss}$ of the superlattice buffered MESFET was reduced by 50% and the GaAs buffered devices destructively broke down.

Although grown from Ga and As beam fluxes, the new buffer 12 differs markedly from GaAs grown at normal growth temperatures of approximately 600° C. In addition to its larger resistivity, the growing surface is not reconstructed, as indicated by the RHEED pattern during growth, and the new buffer is optically inactive, as indicated by the photoluminescence (PL) spectrum. However, doped layers of GaAs grown by MBE upon the buffer stabilizing layer 23 are of comparable optical and electrical quality to similar layers grown upon conventional undoped GaAs buffers grown by MBE at 580° C. The PL spectra for the doped films on the new buffer capped by stabilizing layer 23 are essentially identical to those for the doped films on the conventional undoped GaAs buffer.

The new low temperature buffer layer 12 is capable of substantially eliminating radiation transient effects in III-V integrated circuits. The mechanism of transient radiation related failure in III-V circuits is believed to be caused by diffusion of hole-electron pairs that have been generated in the bulk of the III-V substrate by the radiation, into the active region of the devices fabricated on the surface of the substrate. Because of the optoelectronic inertness and insulating characteristics of the new III-V buffer layer, it should eliminate the undesirable effects of radiation on circuit performance. Not only should the buffer itself not be susceptible to the radiation, but the charge carriers generated in the semi-insulating III-V substrate should be blocked from entering the active region of the device by the presence of the intervening buffer layer.

Recent measurements of GaAs MESFET devices incorporating the new MBE low temperature buffer layer indicate that the new MBE buffer does, indeed, substantially reduce the sensitivity of MESFET devices to pulsed ionizing radiation. Transient radiation measurements were made on a MESFET device with an undoped GaAs buffer layer and on a MESFET device with the new MBE buffer layer. The MESFET with the new MBE low temperature buffer layer showed an overall several order of magnitude reduction in sensitivity to pulsed ionizing radiation as compared with the MESFET with the undoped GaAs buffer layer.

II. GaAs On Si High Electron Mobility Transistor (HEMT) Embodiment

Figure 3:
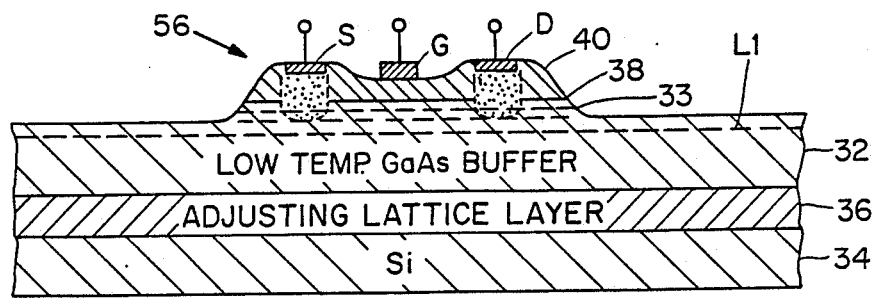
FIG. 3 is a schematic cross-section of an alternate embodiment of the invention in which a GaAs device is formed on a buffer layer of the invention, which layer is formed over a silicon substrate.

FIG. 3 is a cross-sectional view of an alternate embodiment of the invention, wherein a HEMT device 56 is formed on the buffer stabilization layer 33.

Layer 33, the buffer stabilizing layer, is formed by MBE, as in the FIG. 1 embodiment, on a low temperature MBE GaAs buffer 32. Unlike FIG. 1, the GaAs buffer 32 is formed over a silicon (Si) substrate 34, with an adjusting lattice layer of GaAs 36 sandwiched between to serve as a growth stabilizing layer. The use of the Si substrate has the advantage that Si devices may be formed on laterally adjacent isolated regions of the surface of substrate 34 and conductively coupled by suitable metallization to the GaAs HEMT device 56, thus providing a GaAs/Si monolithic integrated structure, wherein the electro-optical properties of the GaAs material may be conveniently combined with the electronic properties of the Si material. A suitable isolation technique is proton bombardment of the active layers 38 and 40 down to the stabilizing or buffer layers 33 and 32 laterally adjacent the device 56 to convert the volume bombarded to semi-insulating material. Alternatively, mesa etching, as in FIG. 3, can be used for isolation.

After GaAs buffer layer 32 is formed, the upper surface is reconstructed and a stabilizing layer 33 is formed, as previously described. Next, a GaAs/AlGaAs HEMT device is formed on the stabilizing layer by MBE deposition of an undoped low bandgap GaAs layer 38, followed by MBE deposition of an n+ modulation doped higher bandgap AlGaAs layer 40. At the interface between the two layers 38 and 40, a two dimensional electron gas is formed, which contributes to the high electron mobility of the HEMT device (See "Gallium Arsenide Technology", Howard W. Sams & Co. 1985, Chapter 4, pp 107-153 for a more detailed discussion of HEMT's). Suitably ohmic drain D and source S contacts are evaporated onto the AlGaAs layer 40 with a Schottky-barrier type electrode G being formed between the two in the well-known manner. It should be noted that while the GaAs HEMT device 56 is shown for illustrative purposes in FIG. 3, any III-V compound device which can be grown on GaAs is intended to be included in this embodiment.

III. Optoelectronic Device

Figure 4:
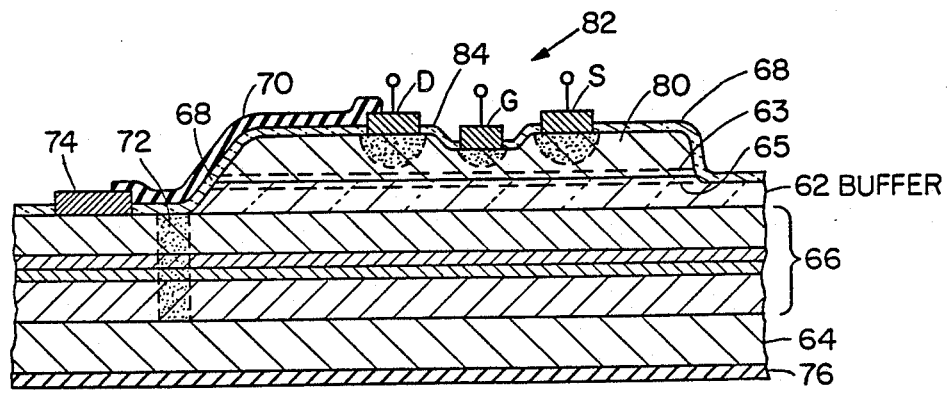
FIG. 4 is a schematic cross-section of another embodiment of the invention in which an optical device and an electronic device are monolithically combined using the buffer layer of the invention for vertical optoelectronic isolation.

The essentially zero electrical conductivity, and optically inert properties of the new low temperature buffer material, may be advantageously utilized in the formation of an integrated optoelectronic circuit. Such a circuit will now be described in connection with FIG. 4. In the embodiment of FIG. 4, a GaAs/AlGaAs double heterostructure epitaxial laser region 66 is formed by conventional techniques, i.e., liquid phase epitaxy (LPE) or MBE, on a GaAs substrate 64. A low temperature buffer layer 62, with a reconstructed surface 65 and a buffer stabilizing layer 63, is the formed, as in the previously described embodiments. This optically inert/non-conductive buffer serves as a vertical isolation layer. Next, an n-GaAs FET layer 80 is formed on the stabilizing layer 63.

In the region where the laser is formed, the layers 80, 63, 65, and 62 are removed, as by etching, and proton bombardment applied to the underlying structure, to form a lateral isolation region 72. An insulating layer 68 of, for example, SiO$_2$, or polyimide, is then formed over the top surface. The layer 68 is etched away in regions where the laser contact 74 and drain D and source S contacts for the MESFET 82 are to be formed.

Appropriate metallization/doping is applied to the regions of the openings to form the contacts and further openings in the oxide 68 are formed and the FET layer 80 recessed. Gate contact G is formed through an additional insulating mask region 84. Metallization 70 is applied over layer 68 to interconnect MESFET 82 to laser contact 74. A suitable contact 76 is then formed on substrate 64. (See T. Fukuzawa, et al., "Monolithic Integration of GaAlAs Injection Laser with a Schottky-gate Field Effect Transistor", *Appl. Phys. Lett.* Vol. 36, pp. 181-183, (1980) and N. Baz-Chaim, et al., "GaAs Integrated Optoelectronics", *IEEE Trans. on Electron. Devices*, Vol. ED-29, pp. 1372-1381, 1982 for a description of conventional process steps for MESFET and laser integration.)

The laser may be optionally formed as a two dimensional array of surface-emitting diode lasers, as described in J.P. Donnelly, et al., "Monolithic Two-Dimensional Surface-Emitting Arrays of GaAs/AlGaAs Diode Lasers", *Appl. Phys. Lett.*, Vol. 51, pp. 1138-1140, 1987.

IV. MISFET Device

Figure 5:
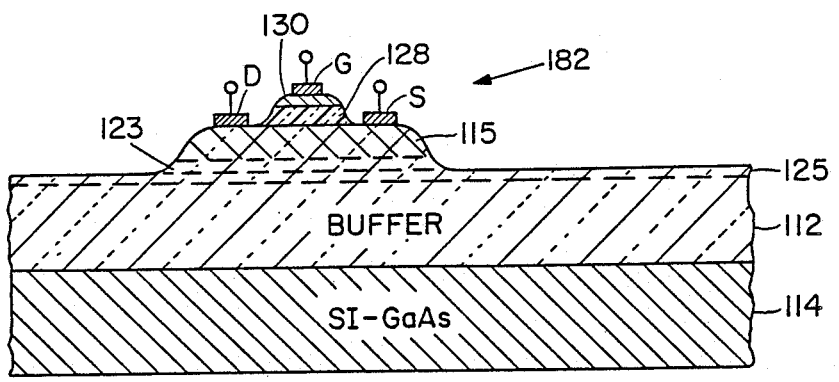
FIG. 5 is a schematic cross-section of a metal-insulator-semiconductor-field-effect-transistor (MISFET) embodiment of the invention.

The ability to fabricate silicon MOSFET devices (metal-oxide-semiconductor-field-effect-transistors) has made possible NMOS and CMOS very large scale integration (VLSI) technology, the workhorses of today's computers and electronics. Heretofore, GaAs MOSFET or MISFET (metal-insulator-semiconductor-field-effect-transistors) devices have not been possible, because the oxide or insulator pins the GaAs Fermi level at the surface due to a large density of interface states. Considerable effort has been undertaken to develop an insulating layer that does not pin the GaAs Fermi level at the surface. To date, these efforts have not met with commercial success. In the embodiment of FIG. 5, a GaAs MISFET is shown which has a number of advantages relative to GaAs MESFET's. Some of these advantages are: reduced gate current, more uniform and larger threshold voltage, larger logic voltage swings, and the possibility of making complementary III-V MISFET integrated circuits.

We have fabricated n-channel depletion-mode GaAs MISFET's and MIS capacitors using the new low temperature buffer as the gate insulator. A GaAs MISFET structure is illustrated in FIG. 5. The substrate 114, buffer 112, annealed region of the buffer 125, stabilization layer 123, and the active FET layer 115, are the same as for the MESFET of FIG. 1, previously described. On top of the active layer 115, a thin layer 128 of the low temperature buffer (50-1000 Å) is formed, as previously described, with an annealed restructured region and stabilizing layer (not shown). A GaAs gate layer 130 (50-250 Å thick) is then deposited by MBE over the gate buffer layer 128. The gate metal G is deposited on the upper GaAs gate layer 130. Regions of the upper GaAs layer 130 and the upper buffer layer 128 are removed laterally adjacent the gate region and ohmic contacts D and S, for the drain and source, respectively, are fabricated in these regions on the active FET layer 115. Either Mesa isolation, or photon bombardment, is used to isolate the individual devices 182.

MISFET I-V (current-voltage) characteristics of an experimental device, fabricated as above, show that the channel region beneath gate G can be fully pinched-off and the MIS C-V (capacitance-voltage) characteristics show a low interface state density. This device has not yet been optimized, although the preliminary results are encouraging. Alternative layers to the top thin GaAs gate layer 130 include thin layers of AlGaAs, thin insulating layers, such as silicon dioxide or silicon nitride, or thin composite layers of these materials. The MISFET depicted in FIG. 5 is an n-channel, depletion mode device. It is expected that n-channel and p-channel depletion, enhancement, and inversion mode GaAs MISFET devices may be possible using the new low temperature buffer layer as the gate insulator.

Equivalents

This completes the description of the preferred and alternate embodiments of the invention. Those skilled in the art may recognize other equivalents to the specific embodiments described herein, which equivalents are intended to be encompassed by the claims attached hereto. For example, other combinations of III-V materials are contemplated for use as low temperature buffer layers, stabilizing layers, and active layers.

The table below lists various combinations of III-V materials in column 1 versus normal or typical MBE substrate growth temperatures in column 2, approximate recommended substrate growth temperatures for the MBE buffer layer in column 3, and approximate recommended substrate growth temperatures for the stabilizing layer in column 4.

TABLE

| 1 | 2 | 3 | 4 |
|---|---|---|---|
| GaAs | 580° C. | 150-300° C. | 300-550° C. |
| GaP | 550° C. | 150-300° C. | 350-500° C. |
| InP | 450° C. | 50-200° C. | 350-450° C. |
| AlGaAs | 680° C. | 150-450° C. | 500-600° C. |

We claim:

1. A method of making an intermediate optically inert, electrically insulating crystalline layer of GaAs material on a substrate for growth thereon of high quality crystalline films comprising the steps of:
   (a) forming in a chamber said crystalline layer of GaAs material by low temperature molecular beam deposition at less than 300° C. of a flux of Ga and As molecular beam specie on a surface of a substrate formed of III-V materials;
   (b) subjecting said layer to a heat treatment in an ambient containing arsenic;
   (c) forming a thin stabilizing layer over said heat treated layer to minimize out diffusion of the arsenic.

2. The method of claim 1 wherein the low temperature is in the range of 150-300° C.

3. A method of making GaAs device on a structure comprising the steps of:
   (a) forming in a chamber, a crystalline buffer layer of GaAs material by low temperature molecular beam deposition at below 300° C. of a flux of Ga and As materials on a surface of a substrate formed from the group comprising III-V materials;
   (b) subjecting said layer to a heat treatment in an ambient containing arsenic;
   (c) forming a thin stabilizing layer of GaAs material over said heat treated layer to minimize out diffusion of the arsenic;
   (d) forming said GaAs device on said stabilizing layer.

4. The method of claim 3 wherein the active device is a MESFET.

5. The method of claim 3 wherein the GaAs device is formed in a crystalline active layer grown on said stabilizing layer.

6. The method of claim 5 wherein the buffer layer has a resistivity of greater than $10^7$ ohm-cm.

7. A method of making an intermediate buffer structure for growth thereon of high quality crystalline electro-optical films comprising the steps of:
   (a) in a chamber, forming a crystalline buffer layer of thickness greater than 300° Å of material by low temperature molecular beam deposition at less than 300° C. of a flux of Ga and As molecular beam specie on a surface of a substrate, which surface is comprised of materials from the same III-V group of materials as in the buffer layer;
   (b) subjecting said buffer layer to a heat treatment at less than 900° C. in an ambient containing arsenic;
   (c) forming a thin stabilizing layer over said heat treated layer to minimize out diffusion of the arsenic; thereby to produce a stable buffer layer which is optically inert and electrically insulating.

8. The method of claim 1 wherein the low temperature in step (a) is in the range of 150-300° C. and the inert treatment in step (b) occurs at a temperature less than 900° C.

9. The method of claim 7 wherein the substrate is formed of semi-insulating GaAs.

10. A method of making a III-V device on a substrate comprising the steps of:
   (a) forming a buffer layer of III-V material by low temperature molecular beam deposition at less than 300° C. of a flux of III-V molecules on said GaAs substrate in a chamber;
   (b) subjecting said layer to a heat treatment in an ambient containing As;
   (c) forming a thin stabilizing layer of III-V material over said heat treated layer to minimize out diffusion of the As;
   (d) forming said III-V device on said stabilizing layer.

* * * * *